(12) United States Patent
Pang et al.

(10) Patent No.: US 12,261,110 B2
(45) Date of Patent: Mar. 25, 2025

(54) ELECTRONIC ASSEMBLY HAVING MULTIPLE SUBSTRATE SEGMENTS

(71) Applicant: Tesla, Inc., Austin, TX (US)

(72) Inventors: Mengzhi Pang, Cupertino, CA (US); Shishuang Sun, Cupertino, CA (US); Ganesh Venkataramanan, Sunnyvale, CA (US)

(73) Assignee: Tesla, Inc., Austin, TX (US)

(*) Notice: Subject to any disclaimer, the term of this patent is extended or adjusted under 35 U.S.C. 154(b) by 14 days.

(21) Appl. No.: 17/807,475

(22) Filed: Jun. 17, 2022

(65) Prior Publication Data
US 2022/0392836 A1     Dec. 8, 2022

Related U.S. Application Data

(62) Division of application No. 16/766,616, filed as application No. PCT/IB2018/059537 on Nov. 30, 2018, now Pat. No. 11,367,680.

(60) Provisional application No. 62/596,217, filed on Dec. 8, 2017.

(51) Int. Cl.
*H01L 23/522* (2006.01)
*H01L 21/48* (2006.01)
(Continued)

(52) U.S. Cl.
CPC ........ *H01L 23/5223* (2013.01); *H01L 21/485* (2013.01); *H01L 23/36* (2013.01);
(Continued)

(58) Field of Classification Search
CPC ........... H01L 21/485; H01L 2225/1035; H01L 2225/06589; H01L 24/20; H01L 24/19;
(Continued)

(56) References Cited

U.S. PATENT DOCUMENTS 8,623,753 B1   1/2014  Yoshida et al.
9,831,195 B1  11/2017  Lu
(Continued)

FOREIGN PATENT DOCUMENTS

DE    102016118802   8/2017
EP        3 462 478   4/2019
WO    WO 08/026077   3/2008

OTHER PUBLICATIONS

International Search Report and Written Opinion dated Jun. 13, 2019 in PCT/IB2018/059527.

*Primary Examiner* — Dale E Page
*Assistant Examiner* — Lawrence C Tynes, Jr.
(74) *Attorney, Agent, or Firm* — Knobbe, Martens, Olson & Bear, LLP

(57) ABSTRACT

An electronic assembly includes a mechanical carrier, a plurality of integrated circuits disposed on the mechanical carrier, a fan out package disposed on the plurality of integrated circuits, a plurality of singulated substrates disposed on the fan out package, a plurality of electronic components disposed on the plurality of singulated substrates, and at least one stiffness ring disposed on the plurality of singulated substrates. A method for constructing an electronic assembly includes identifying a group of known good singulated substrates, joining the group of known good singulated substrates into a substrate panel, attaching at least one bridge to the substrate panel that electrically couples at least two of the known good singulated substrates, and mounting a plurality of electronic components onto the substrate panel, each electronic component of the plurality of electronic components corresponding to a respective known good singulated substrate.

5 Claims, 14 Drawing Sheets

(51) Int. Cl.
*H01L 23/36* (2006.01)
*H01L 23/498* (2006.01)
*H01L 23/538* (2006.01)
*H01L 25/065* (2023.01)

(52) U.S. Cl.
CPC .... *H01L 23/49816* (2013.01); *H01L 23/5385* (2013.01); *H01L 23/5386* (2013.01); *H01L 25/0652* (2013.01)

(58) Field of Classification Search
CPC ..... H01L 23/5386; H01L 23/538–5389; H01L 23/49833; H01L 23/5385; H01L 23/5383; H01L 23/49822; H01L 23/12–15; H01L 2224/73267; H01L 2224/92244; H01L 2224/24137; H01L 25/16; H01L 25/0652; H01L 25/071; H01L 25/112; H01L 25/042; H01L 25/0655; H01L 25/072; H01L 25/0753; H01L 25/115
See application file for complete search history.

(56) References Cited

U.S. PATENT DOCUMENTS

| | | | |
|---|---|---|---|
| 11,367,680 B2 | 6/2022 | Pang et al. | |
| 2007/0145548 A1* | 6/2007 | Park | H01L 21/6835 257/E25.013 |
| 2008/0157318 A1* | 7/2008 | Chow | H01L 23/552 257/E23.169 |
| 2008/0180878 A1* | 7/2008 | Wang | H05K 1/162 361/306.3 |
| 2009/0194873 A1* | 8/2009 | Lim | H01L 23/3107 257/784 |
| 2010/0155927 A1 | 6/2010 | Cheah | |
| 2013/0075917 A1 | 3/2013 | Law et al. | |
| 2014/0346671 A1 | 11/2014 | Yu | |
| 2016/0013151 A1 | 1/2016 | Shen | |
| 2016/0088736 A1* | 3/2016 | Sankman | H05K 1/162 361/748 |
| 2017/0025385 A1 | 1/2017 | Song et al. | |
| 2017/0084596 A1 | 3/2017 | Scanlan | |

* cited by examiner

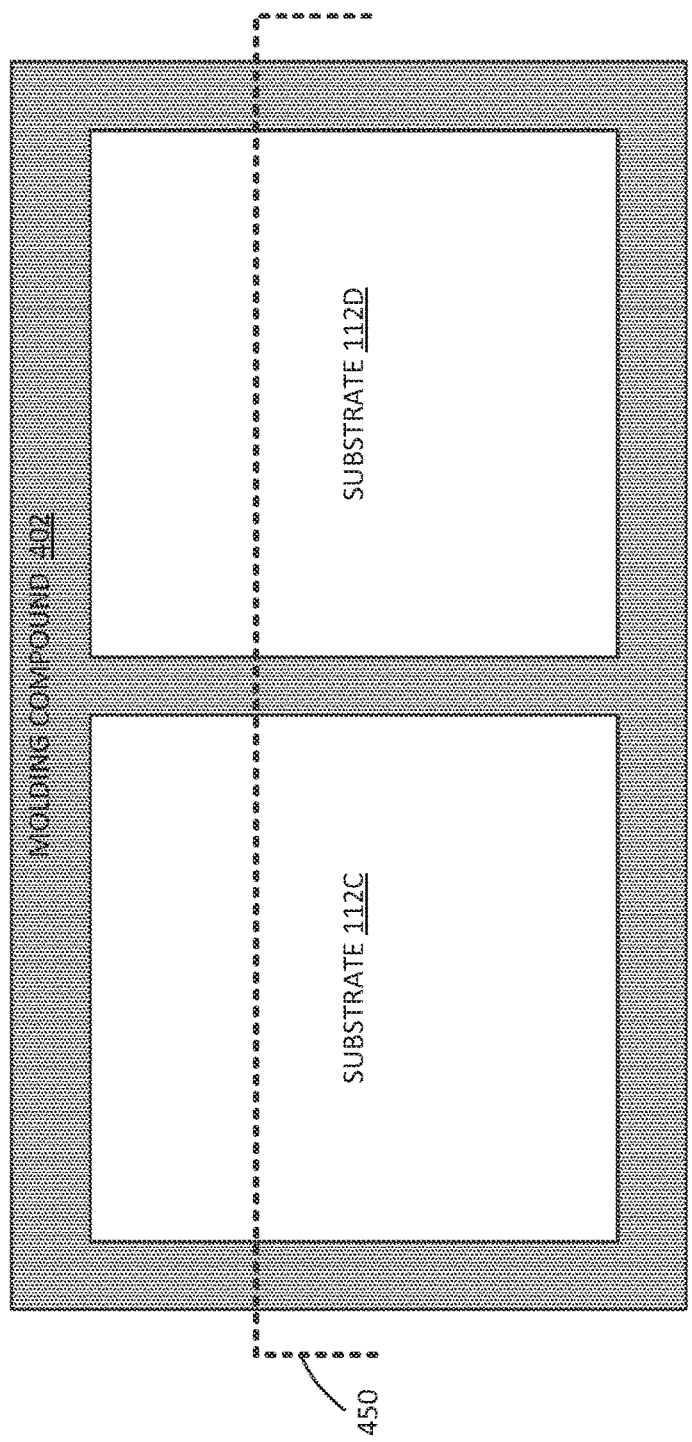
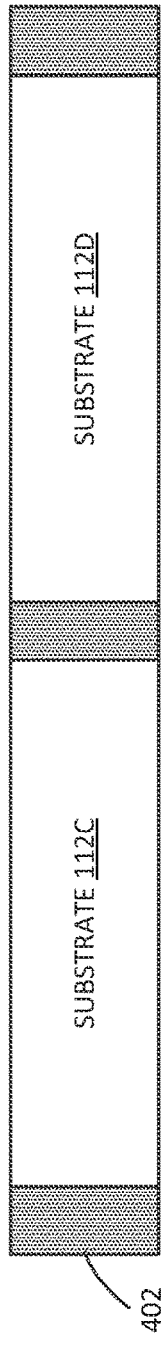
FIG. 4A
FIG. 4B

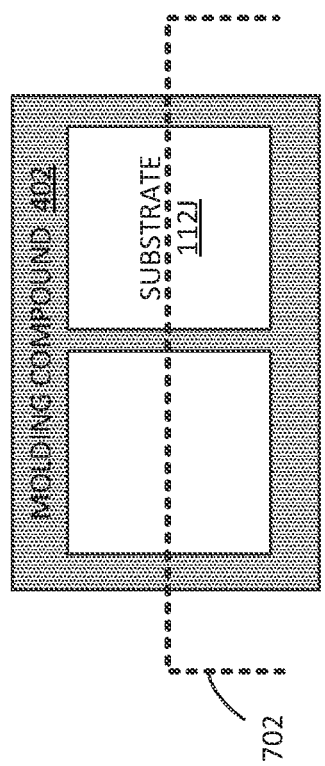
FIG. 7A
FIG. 7B

ELECTRONIC ASSEMBLY HAVING MULTIPLE SUBSTRATE SEGMENTS

CROSS-REFERENCE TO RELATED APPLICATIONS

This application claims priority to, and is a divisional of, U.S. patent application Ser. No. 16/766,616 titled "ELECTRONIC ASSEMBLY HAVING MULTIPLE SUBSTRATE SEGMENTS" and filed on May 22, 2020, the disclosure of which is hereby incorporated herein by reference in its entirety. Any and all applications for which a foreign or domestic priority claim is identified in the Application Data Sheet as filed with the present application are hereby incorporated by reference under 37 CFR 1.57

BACKGROUND OF THE INVENTION

Technical Field

The present invention relates generally to electronics, and more specifically to electronic assemblies.

Description of Related Art

Electronic assemblies are used with a vast multitude of industrial and consumer applications. Electronic assemblies typically include a plurality of packaged integrated circuits that reside upon a substrate panel such as a Printed Circuit Board (PCB). However, many installations have size constraints, limiting the area that may be occupied by the electronic assembly. Thus, some electronic assemblies include multiple differing layers of circuit components stacked upon one another. Such construct allows the components to extend in not only an X-Y direction of the substrate but in the Z direction, which is perpendicular to the X-Y direction of the substrate.

Some electronic assemblies include substrate panels that extend across large areas, e.g., 600 mm by 600 mm. These substrate panels may include a large number of individual substrates formed in a grid pattern across the large area to which individual ICs are attached. While using these large substrate panels makes the construct of the electronic assemblies easier it also causes problems. One particular problem relates to large substrate panel yield. A typical ten-layer substrate may be manufactured with only an 80% to 90% yield. Resultantly, if there are 100 substrates in a large substrate panel, the equivalent yield for the substrate panel may be as low as (0.9)100=0.000026. This equivalent yield is unacceptable.

SUMMARY

According to a first embodiment of the present disclosure, an electronic assembly includes a mechanical carrier, a plurality of integrated circuits disposed on the mechanical carrier, a fan out package disposed on the plurality of integrated circuits, a plurality of singulated substrates disposed on the fan out package, a plurality of electronic components disposed on the plurality of singulated substrates, and at least one stiffness ring disposed on the plurality of singulated substrates and surrounding at least some of the plurality of electronic components.

The first embodiment includes a plurality of optional aspects that may be incorporated singularly, in various combinations, or in total. According to a first aspect, the mechanical carrier is a heat spreader. According to a second aspect, the electronic assembly may include an encapsulant disposed on the mechanical carrier that surrounds the plurality of integrated circuits. According to a third aspect, the fan out package is a Redistribution Layer (RDL) package. According to a fourth aspect, at least some of the plurality of singulated substrates are substrates having embedded capacitors. According to a fifth aspect, the electronic includes a plurality of electrical connections between a first singulated substrate and a second singulated substrate of the plurality of singulated substrates. According to a sixth aspect, the stiffness ring of the electronic assembly includes the plurality of electrical connections.

According to a second embodiment of the present disclosure a method for constructing an electronic assembly includes identifying a group of known good singulated substrates of a plurality of singulated substrates, joining the group of known good singulated substrates into a substrate panel, attaching at least one bridge to the substrate panel that electrically couples at least two of the known good singulated substrates of the group of known good singulated substrates, and mounting a plurality of electronic components onto the substrate panel, each electronic component of the plurality of electronic components corresponding to a respective known good singulated substrate of the group of known good singulated substrates.

The second embodiment also includes a plurality of optional aspects that may be applied singularly, in combination, or in total to the second embodiment. According to a first aspect, the method incudes singulating the plurality of substrates from a constructed panel. According to a second aspect, the plurality of singulated substrates are Printed Circuit Boards (PCBs). According to a third aspect, at least some of the plurality of singulated substrates are substrates having embedded capacitors. According to a fourth aspect, the method includes applying solder balls to at least some of the known good singulated substrates of the substrate panel, wherein the plurality of electronic components is mounted to the substrate panel via the solder balls. According to a fifth aspect, the at least one bridge attaches to the substrate panel via solder balls.

A third embodiment of the present disclosure includes a method for repairing an electronic assembly by identifying a bad substrate of a plurality of substrates of a substrate panel, extracting the bad substrate of the plurality of substrates of the substrate panel to create an opening in the substrate panel, identifying a known good substrate, and installing the known good substrate in the opening in the substrate panel.

According to a first optional aspect of the third embodiment, the method includes attaching at least one bridge to the substrate to electrically couple the known good substrate to at least one other substrate of the substrate panel. According to a second optional aspect of the third embodiment, the method includes attaching at least one bridge to the substrate to stabilize the known good substrate within the substrate panel. According to a third optional aspect, the known good substrate is a Printed Circuit Boards (PCBs). According to a fourth optional aspect, the known good substrate includes embedded capacitors.

BRIEF DESCRIPTION OF THE DRAWINGS

FIG. 4A is a top view diagram illustrating a portion of a substrate panel according to the present disclosure.

FIG. 4B is a sectional diagram illustrating the portion of the substrate panel of FIG. 4A according to the present disclosure.

FIG. 7A is a top view diagram illustrating the portion of the substrate panel of FIG. 6A having the defective substrate removed according to an embodiment of the present disclosure.

FIG. 7B is a sectional diagram illustrating the portion of the substrate panel of FIG. 7A.

DETAILED DESCRIPTION OF THE PREFERRED EMBODIMENT

Figure 1:
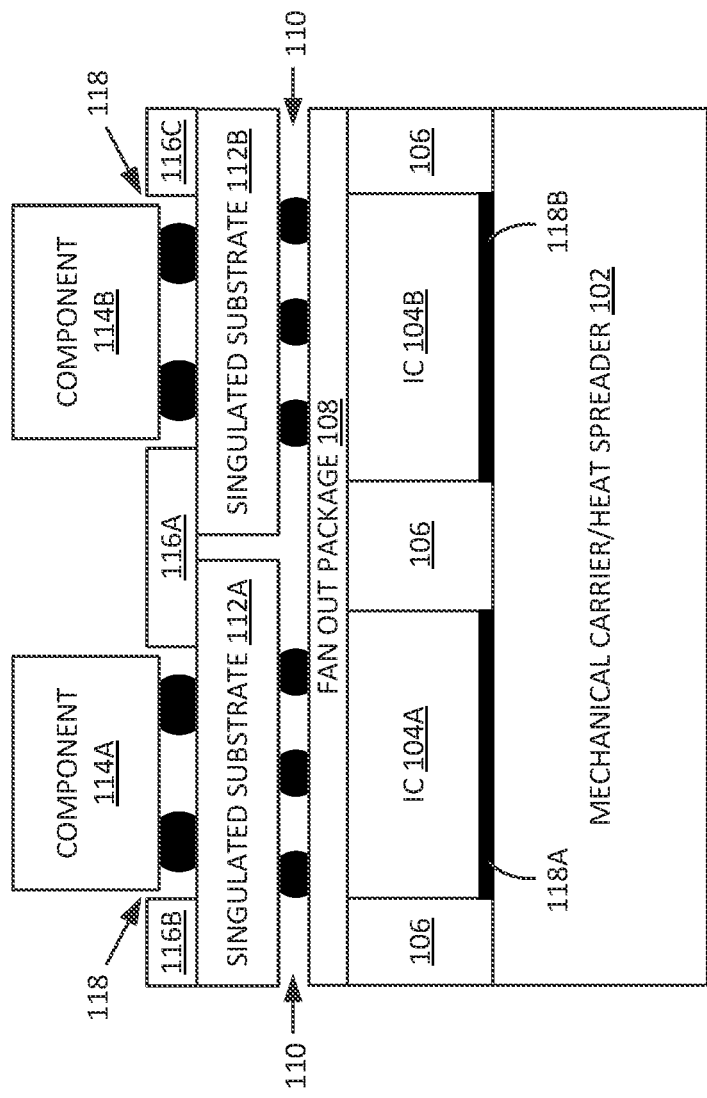
FIG. 1 is a side view diagram illustrating a three-dimensional electronic assembly constructed according to the present disclosure.

FIG. 1 is a side view diagram illustrating a three-dimensional electronic assembly constructed according to the present disclosure. The electronic assembly 100 includes a mechanical carrier 102 that may also serve as a heat spreader. A plurality of integrated circuits (ICs) 104A and 104B are disposed on the mechanical carrier 102 and may couple to the mechanical carrier 102 via adhesive 118A and 118B, respectively. An encapsulant 106 may be disposed on the mechanical carrier 102 such that it surrounds the plurality of ICs 104A and 104B.

A fan out package 108 is disposed on the plurality of ICs 104A and 104B (and the encapsulant 106). The fan out package 108 may be a Redistribution Layer (RDL) package, e.g., flip chip package, which may couple to the plurality of ICs 104A and 104B via Die to Die (D2D) bonding. Alternately, the fan out package 108 may be a Printed Circuit Board (PCB).

A plurality of singulated substrates 112A and 112B are disposed on the fan out package 108 and may be electrically and mechanically coupled to the fan out package 108 via solder balls 110. A plurality of electronic components 114A and 114B are disposed on the plurality of singulated substrates 112A and 112B. At least one stiffness ring 116A, 116B and/or 116C is/are disposed on the plurality of singulated substrates 112A and 112B and may surround at least some of the plurality of electronic components 114A and 114B. The plurality of electronic components 114A and 114B may couple to respective singulated substrates 112A and 112B via solder balls 118. In at least one embodiment, the at least some of the plurality of singulated substrates 112A and 112B are substrates having embedded capacitors.

Figure 2:
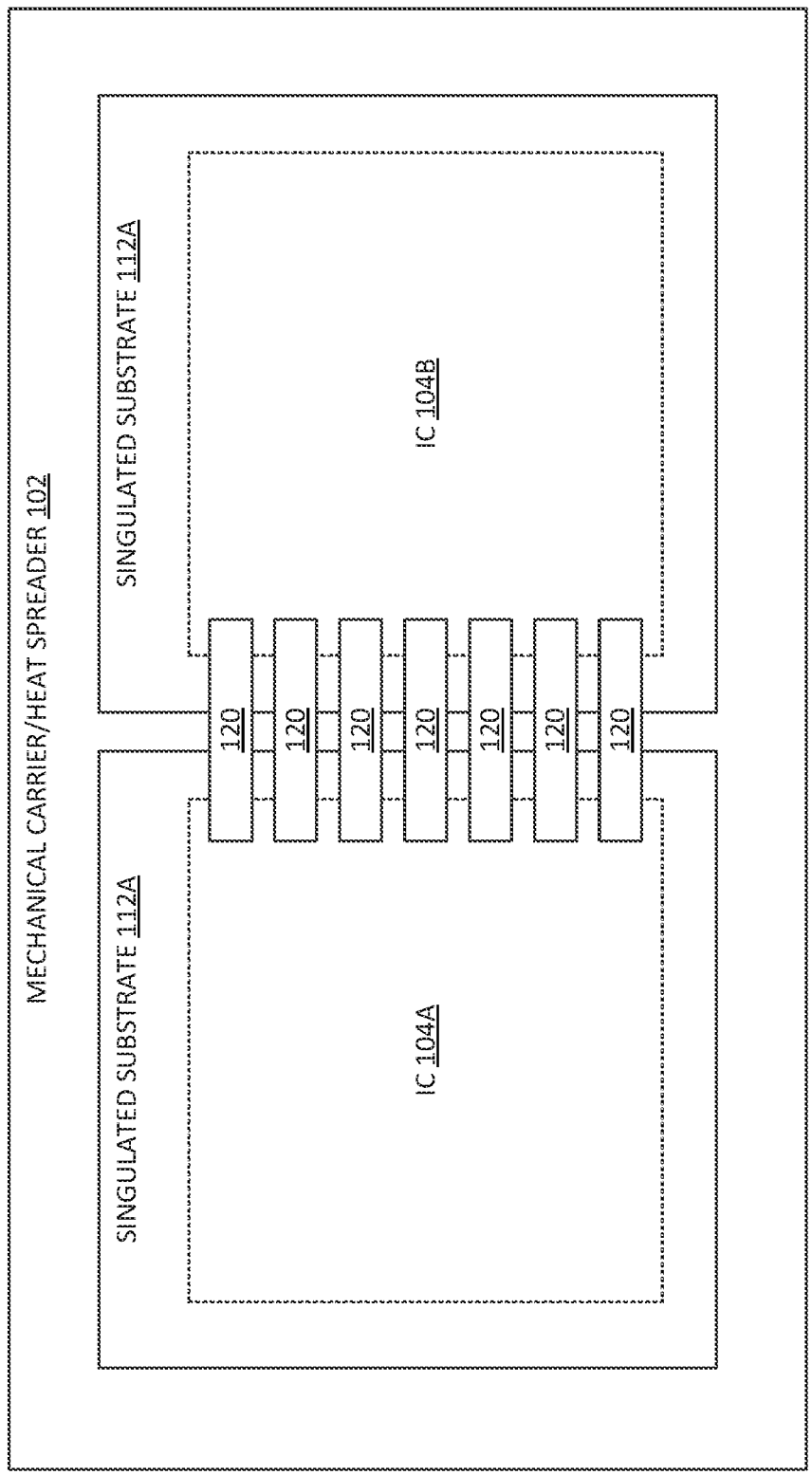
FIG. 2 is a top view diagram illustrating the three-dimensional electronic assembly of FIG. 1 according to the present disclosure.

FIG. 2 is a top view diagram illustrating the three-dimensional electronic assembly of FIG. 1 according to the present disclosure. As shown, the electronic assembly 100 may include a plurality of electrical connections 120 between a first singulated substrate 112A and a second singulated substrate 112B of the plurality of singulated substrates. In some embodiments, the stiffness ring includes the plurality of electrical connections 120. In other embodiments, the electrical connections 120 and the stiffness rings 116A, 116B and/or 116C are differing components.

Figure 3A:
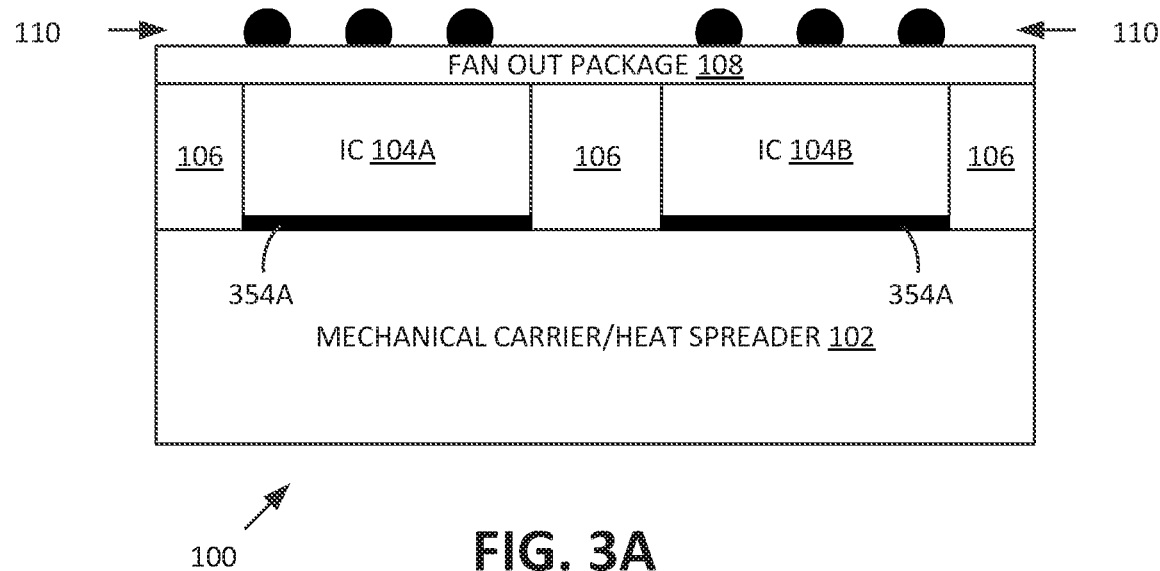
FIG. 3A is a side view diagram illustrating the three-dimensional electronic assembly of FIG. 1 in a first partially completed construct according to the present disclosure.

FIG. 3A is a side view diagram illustrating the three-dimensional electronic assembly of FIG. 1 in a first partially completed construct according to the present disclosure. In the first partially completed construct of FIG. 3A, the electronic assembly 100 is shown to have had the solder balls 110 placed on top of the fan out package 108.

Figure 3B:
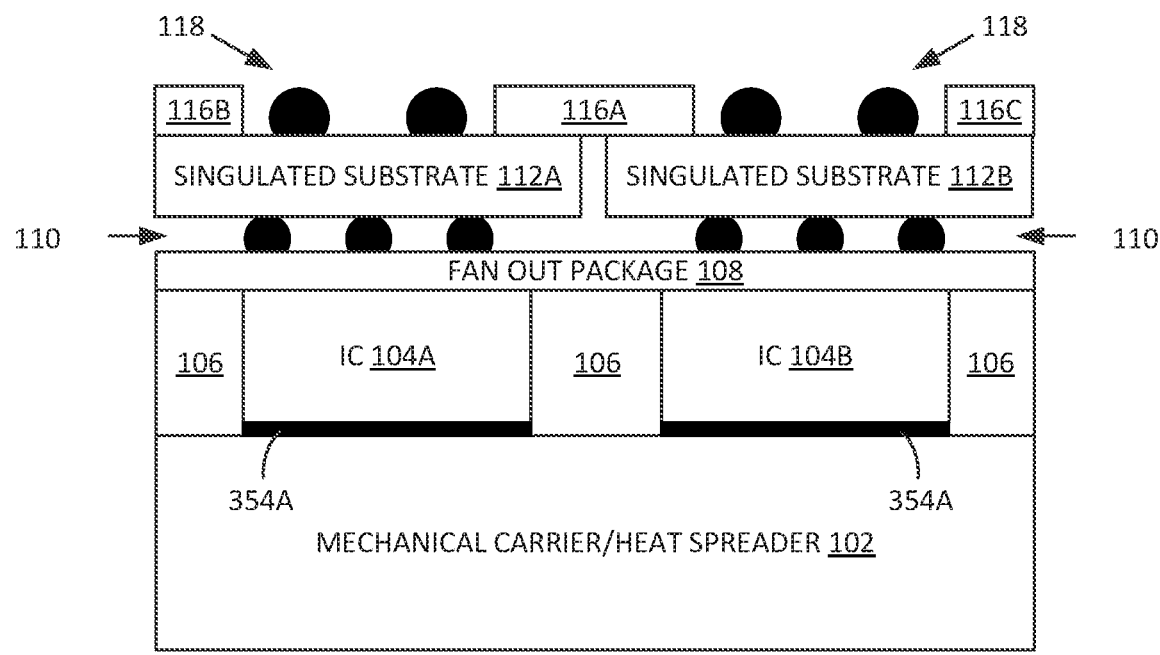
FIG. 3B is a side view diagram illustrating the three-dimensional electronic assembly of FIG. 1 in a second partially completed construct according to the present disclosure.

FIG. 3B is a side view diagram illustrating the three-dimensional electronic assembly of FIG. 1 in a second partially completed construct according to the present disclosure. In the second partially completed construct of FIG. 3B, the electronic assembly 100 is shown to have had the singulated substrates 112A and 112B mounted on to the solder balls 110 residing on top of the fan out package 108. Further, solder balls 118 have been formed on top of the singulated substrates 112A and 112B and the at least one stiffness ring 116A, 116B and/or 116C is/are disposed on the plurality of singulated substrates 112A and 112B.

Figure 3C:
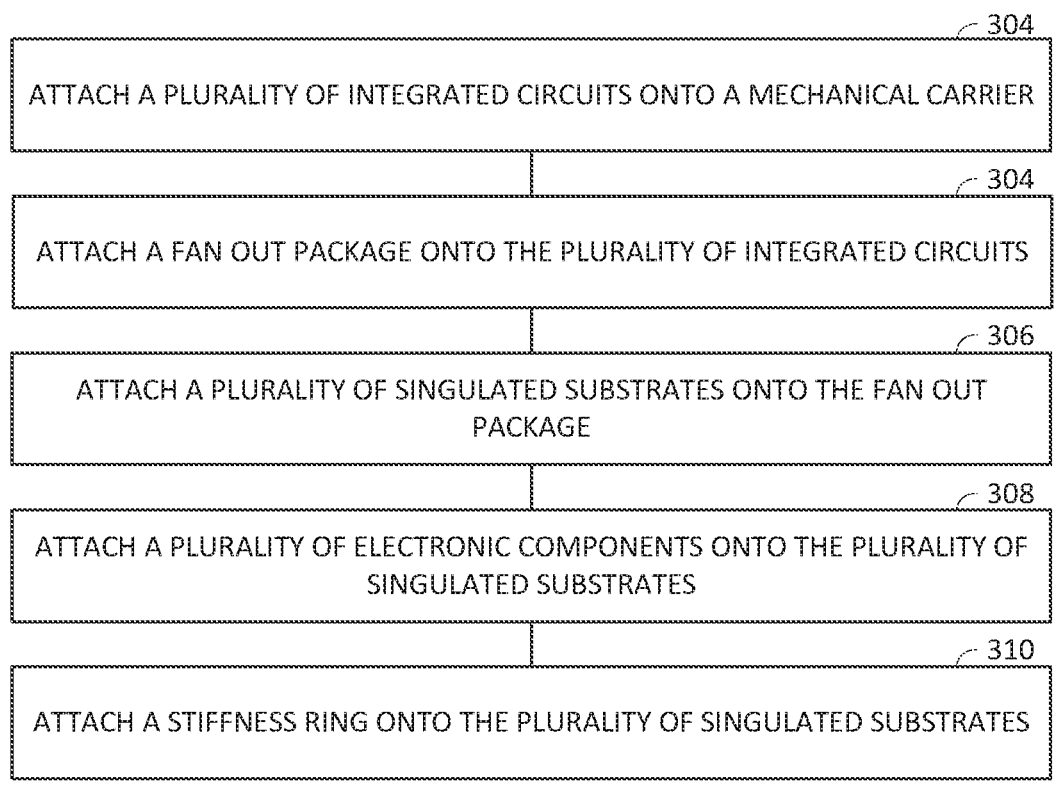
FIG. 3C is a flow chart illustrating a method for constructing the three-dimensional electronic assembly of FIG. 1.

FIG. 3C is a flow chart illustrating a method for constructing the three-dimensional electronic assembly of FIG. 1. The method 300 begins with attaching a plurality of integrated circuits onto a mechanical carrier, which may serve also serve as a heat spreader (step 302). The connection between the plurality of integrated circuits and the mechanical carrier may be via D2D bonding. Next, the method 300 includes attaching a fan out package, which may be an RDL package, onto the plurality of integrated circuits (step 304). The method 300 continues with attaching a plurality of singulated substrates onto the fan out package (step 306). According to one aspect, the singulated substrates are known good singulated substrates. According to another aspect, the connection is via solder balls. The method 300 continues with attaching a plurality of electronic components onto the plurality of singulated substrates, which may be via solder balls (step 308). The method 300 concludes with attaching a stiffness ring onto the plurality of singulated substrates (step 310). Note that in another embodiment, the steps 308 and 310 may be performed in an order differing from that illustrated in FIG. 3C.

FIG. 4A is a top view diagram illustrating a portion of a substrate panel according to the present disclosure. The portion of the substrate panel 400 includes a plurality of substrates 112C and 112D held together via a molding compound 402. With the embodiment of FIG. 4A, the plurality of substrates 112C and 112D are known good substrates. FIG. 4B is a sectional diagram illustrating the portion of the substrate panel of FIG. 4A according to the present disclosure. The sectional diagram of FIG. 4B is taken along section 450 of FIG. 4A to show that the molding compound 402 couples together the plurality of substrates 112C and 112D to form the portion of a substrate panel 400. With the embodiment of FIGS. 4A and 4B as well as FIGS. 5A, 5B, and 5C, the substrates 112C and 112D are PCBs. However, in differing embodiments, the substrates 112C and 112D could be differing substrate types, e.g., semiconductors having embedded capacitors.

Figure 5A:
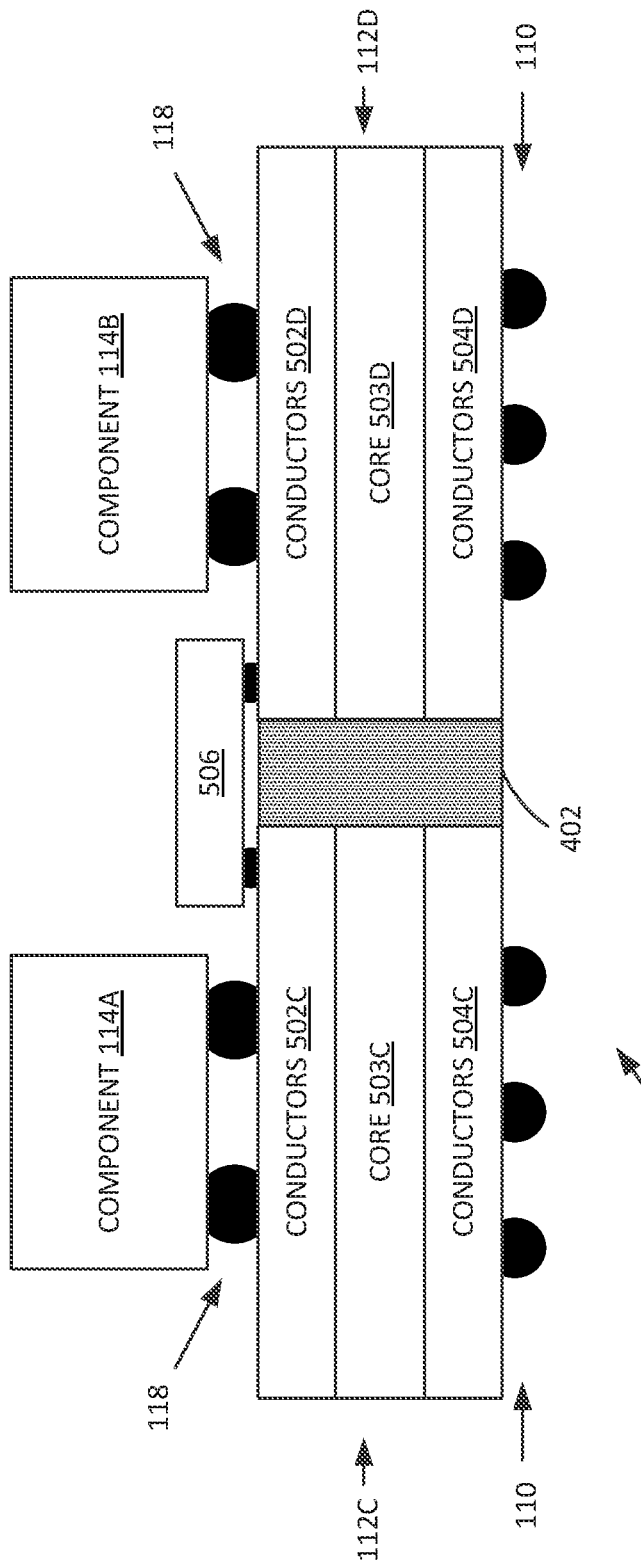
FIG. 5A is a side view diagram illustrating a partial construct of a three-dimensional electronic assembly according to an embodiment of the present disclosure.
Figure 5B:
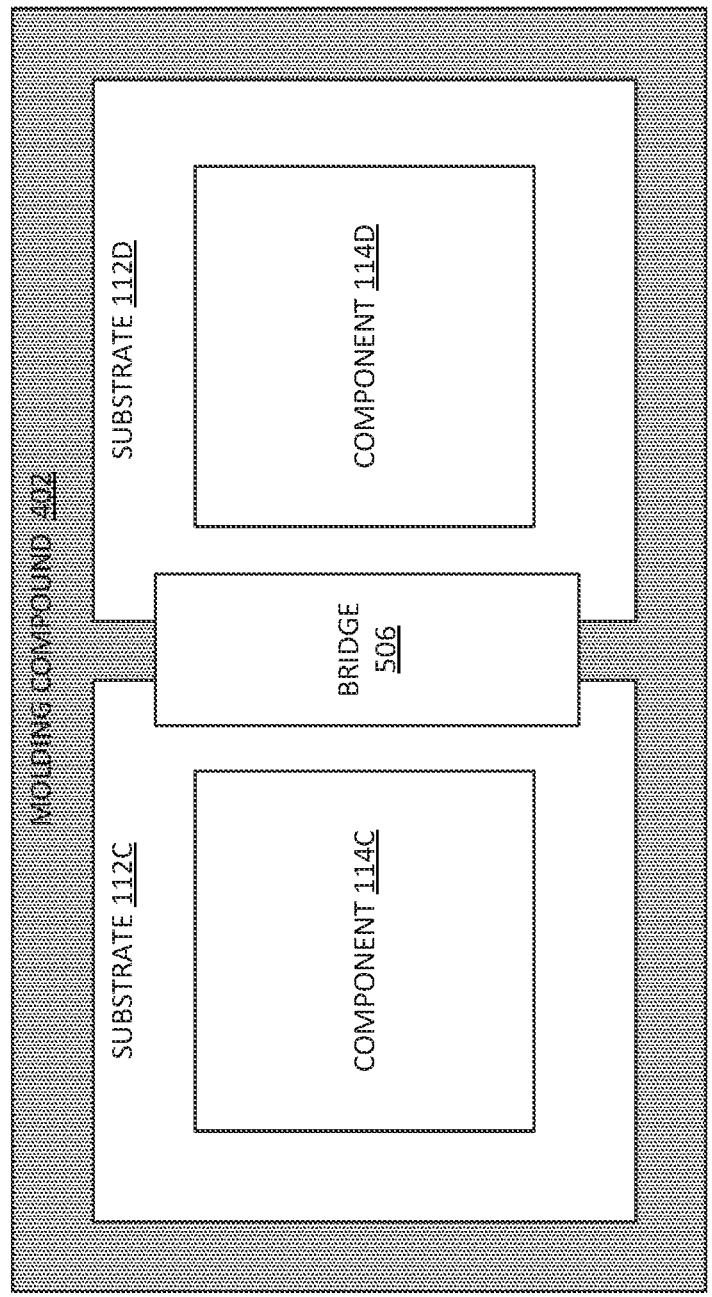
FIG. 5B is a top view diagram illustrating the three-dimensional electronic assembly of FIG. 5A.

FIG. 5A is a side view diagram illustrating a partial construct of a three-dimensional electronic assembly according to an embodiment of the present disclosure. FIG. 5B is a top view diagram illustrating the three-dimensional electronic assembly of FIG. 5A Referring to both FIGs. SA and SB, the three-dimensional electronic assembly 500 includes the plurality of substrates 112C and 112D held together by the molding compound 402. In the embodiment of FIG. 5A, the substrates 112C and 112D are PCBs. Substrate 112C includes conductors 502C, a core 503C, and conductors 504C in a sandwich structure. Further, substrate 112C includes conductors 502D, a core 503D, and conductors 504D in a sandwich structure. Solder balls 110 attach to the substrates 112C and 112D to support future mounting to, e.g., a fan out package, as was shown in FIG. 1. Mounted on the substrates 112C and 112D via solder balls 118 are electronic components 114A and 114B, respectively. A bridge 506 having electrical connections electrically intercouples the substrates 112C and 112D and may attach thereto via solder balls in some embodiments. Alternately, the bridge 506 may attached via a D2D connection and act as an interposer.

Figure 5C:
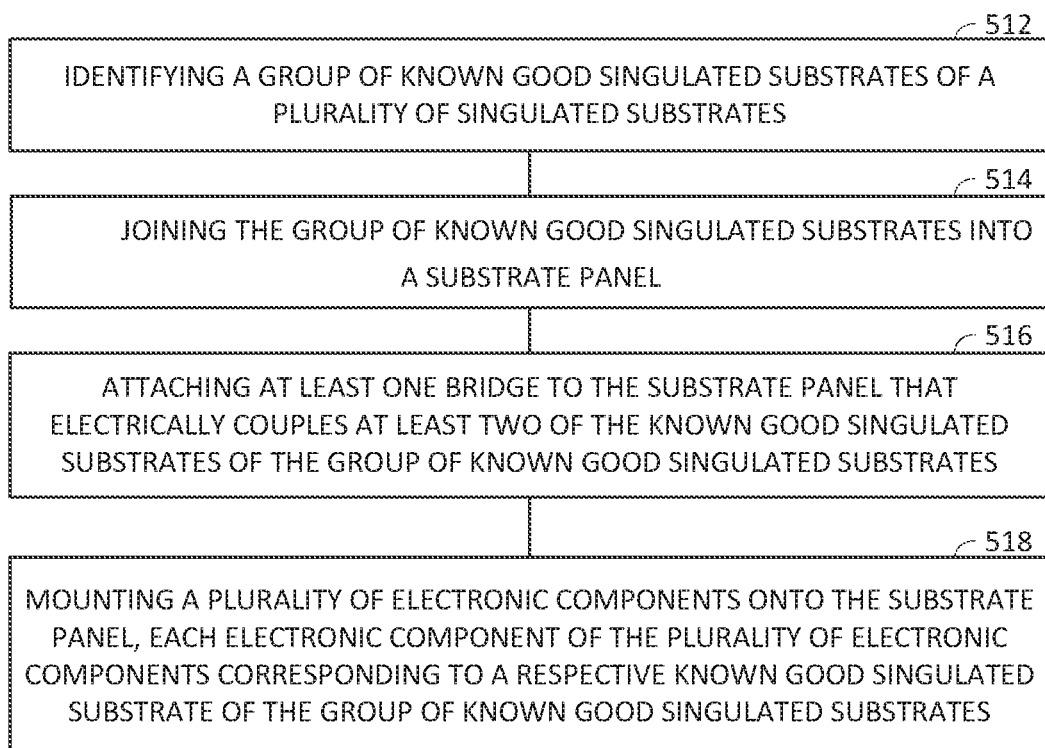
FIG. 5C is a flow chart illustrating a method for constructing the three-dimensional electronic assembly of FIG. 5A.

FIG. 5C is a flow chart illustrating a method for constructing the three-dimensional electronic assembly of FIG. 5A The method 510 for constructing the electronic assembly includes identifying a group of known good singulated substrates of a plurality of singulated substrates (step 512). The method 510 then includes joining the group of known good singulated substrates into a substrate panel, e.g., using a molding compound (step 514). The method further includes attaching at least one bridge to the substrate panel that electrically couples at least two of the known good singulated substrates of the group of known good singulated substrates (step 516). The method concludes with mounting a plurality of electronic components onto the substrate panel, each electronic component of the plurality of electronic components corresponding to a respective known good singulated substrate of the group of known good singulated substrates (step 518). Note that the order of steps 516 and 518 may be reversed in other embodiments.

The method 510 of FIG. 5C may further include singulating the plurality of substrates from a constructed panel. The plurality of singulated substrates may be PCBs. At least some of the plurality of singulated substrates may be substrates having embedded capacitors.

The method 510 may further include applying solder balls to at least some of the known good singulated substrates of the substrate panel, wherein the plurality of electronic components is mounted to the substrate panel via the solder balls. Further, with the method 510 of FIG. SC, the at least one bridge may attach to the substrate panel via solder balls.

Figure 6A:
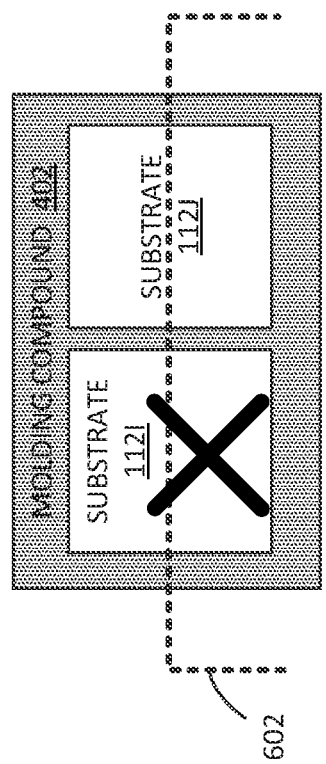
FIG. 6A is a top view diagram illustrating a portion of a substrate panel having a defective substrate according to an embodiment of the present disclosure.
Figure 6B:
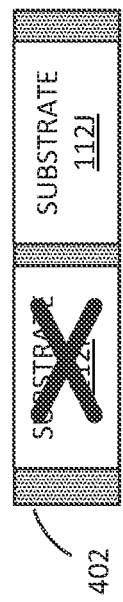
FIG. 6B is a sectional diagram illustrating the portion of the substrate panel of FIG. 6A.

FIG. 6A is a top view diagram illustrating a portion of a substrate panel having a defective substrate according to an embodiment of the present disclosure. FIG. 6B is a sectional diagram taken along section line 602 illustrating the portion of the substrate panel of FIG. 6A. Referring to both FIGS. 6A and 6B, the substrate panel 600 includes substrates 112I and 112J. Substrate 112I is defective.

FIG. 7A is a top view diagram illustrating the portion of the substrate panel of FIG. 6A having the defective substrate removed according to an embodiment of the present disclosure. FIG. 7B is a sectional diagram taken along section line 702 illustrating the portion of the substrate panel of FIG. 7A Referring to both FIGS. 7A and 7B, the defective substrate 112I has been removed.

Figure 8A:
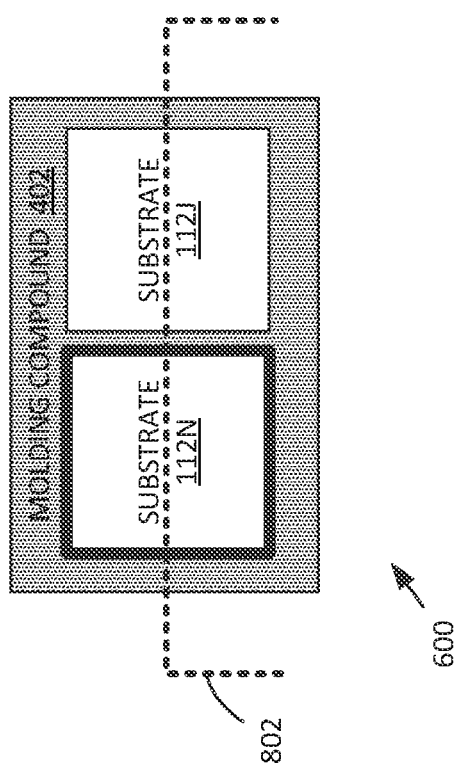
FIG. 8A is a top view diagram illustrating the portion of the substrate panel of FIG. 6A having the defective substrate replaced with a new substrate according to an embodiment of the present disclosure.
Figure 8B:
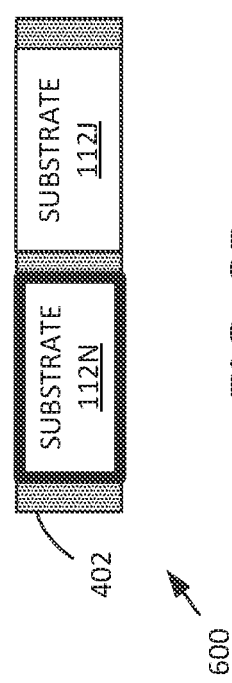
FIG. 8B is a sectional diagram illustrating the portion of the substrate panel of FIG. 8A.

FIG. 8A is a top view diagram illustrating the portion of the substrate panel of FIG. 6A having the defective substrate replaced with a new substrate according to an embodiment of the present disclosure. FIG. 8B is a sectional diagram taken along section line 802 illustrating the portion of the substrate panel of FIG. 8A. Referring to both FIGS. 8A and 8B, the defective substrate 112I has been replaced with known good substrate 112N.

Figure 8C:
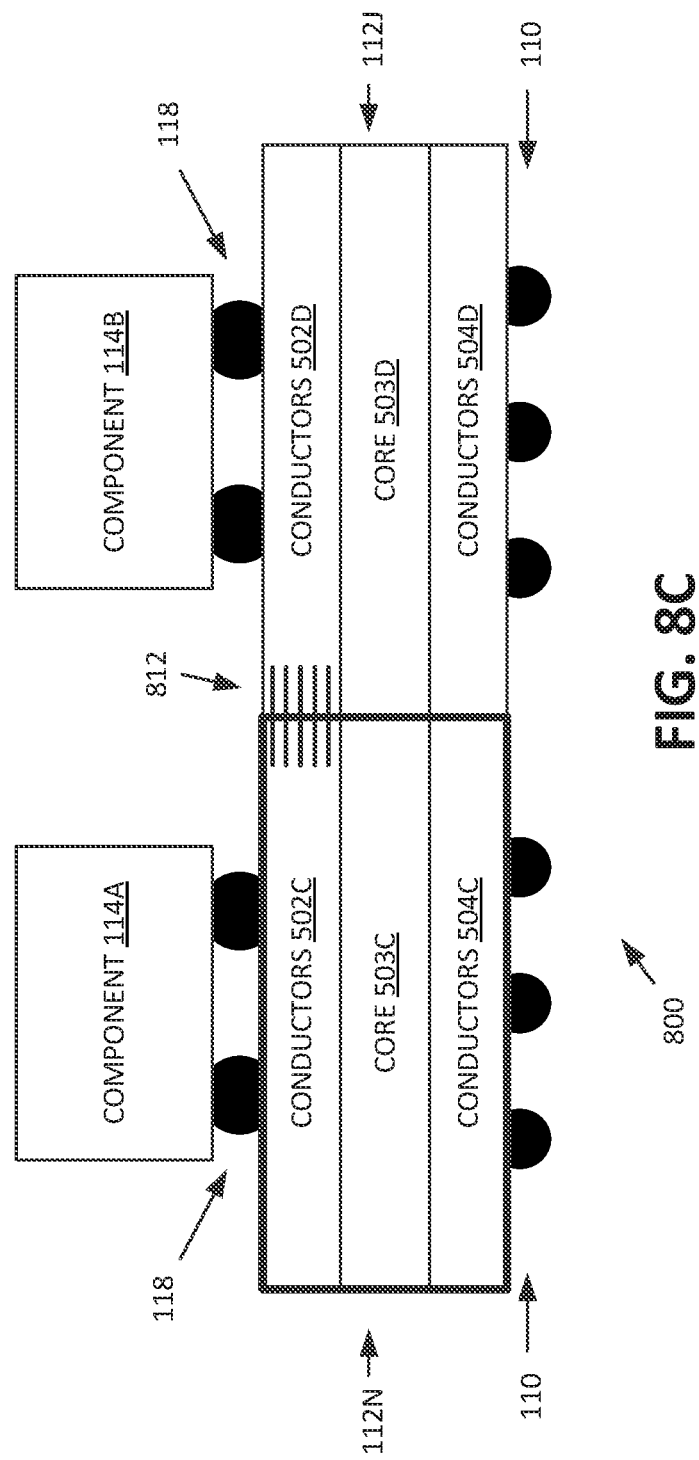
FIG. 8C illustrates a three-dimensional electronic assembly that includes two substrates that are electrically coupled after replacement of the defective substrate with the new substrate.

FIG. 8C illustrates a three-dimensional electronic assembly 800 that includes two substrates 112N and 112J that are electrically coupled via electrical connections 812 after replacement of the defective substrate 112I with the new, known good substrate 112N.

Figure 8D:
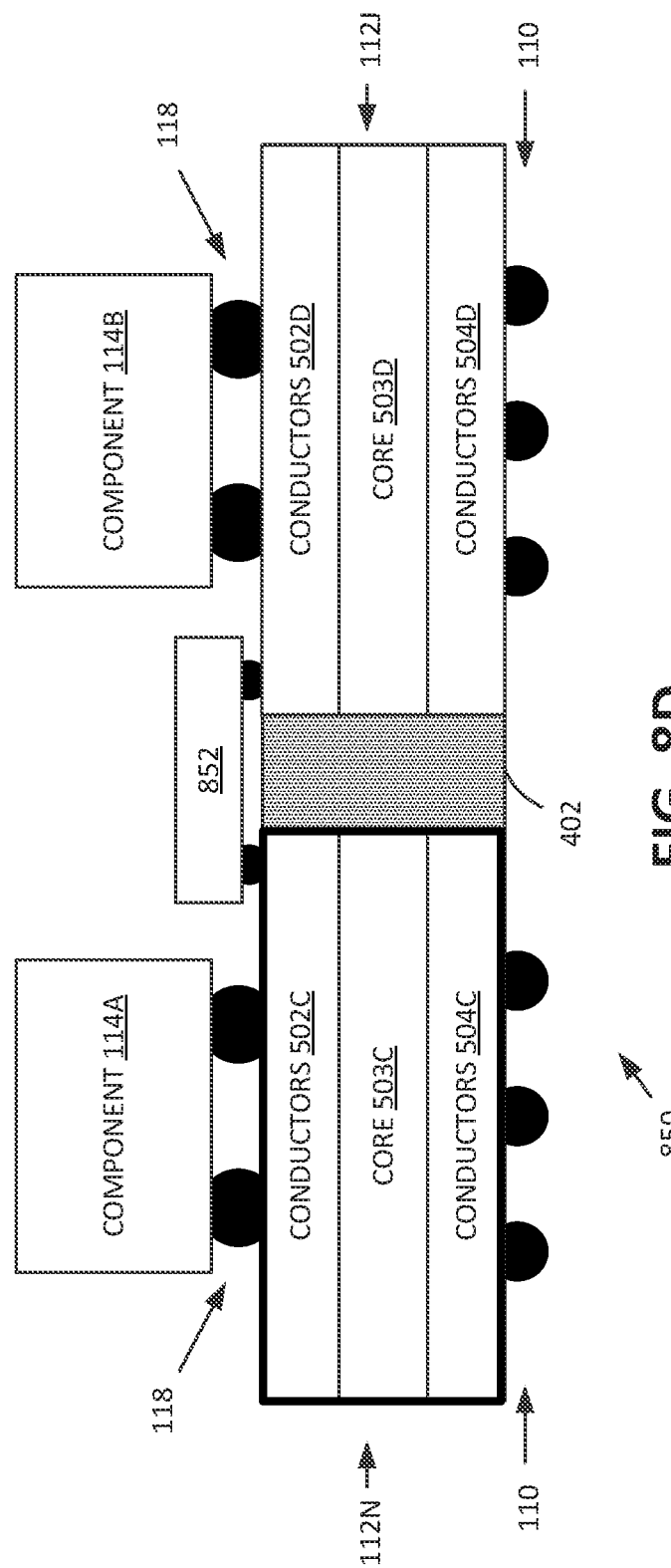
FIG. 8D illustrates a three-dimensional electronic assembly that includes two substrates that are electrically coupled via bridge after replacement of the defective substrate with the new, known good substrate.

FIG. 8D illustrates a three-dimensional electronic assembly 850 that includes two substrates 112N and 112J that are electrically coupled via bridge 852 after replacement of the defective substrate 112I with the new, known good substrate 112N.

Figure 9:
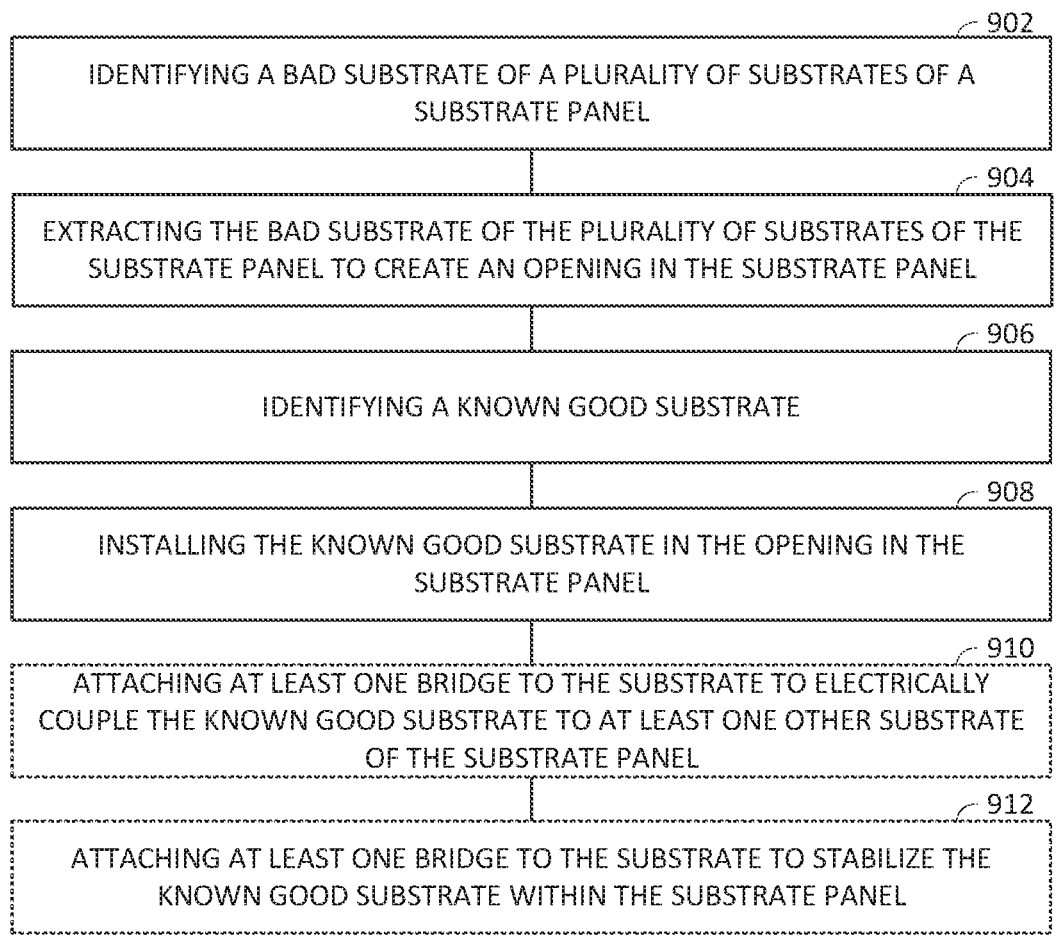
FIG. 9 is a flow chart illustrating a method for replacing a defective substrate of a substrate panel according to an embodiment of the present disclosure.

FIG. 9 is a flow chart illustrating a method for replacing a defective substrate of a substrate panel according to an embodiment of the present disclosure. The method 900 begins by identifying a bad substrate of a plurality of substrates of a substrate panel (step 902). The method 900 continues with extracting the bad substrate of the plurality of substrates of the substrate panel to create an opening in the substrate panel (step 904). The method 900 next includes identifying a known good substrate (step 906). The method 900 next includes installing the known good substrate in the opening in the substrate panel (step 908).

The method 900 may include electrically connecting the known good substrate to a neighboring substrate as illustrated in FIG. 8C. The method 900 optionally includes attaching at least one bridge to the known good substrate and a neighboring substrate to electrically couple the known good substrate to at least one other substrate of the substrate panel (step 910). This structure was previously illustrated in FIG. 8D. Further, the method 900 optionally includes attaching at least one bridge, e.g., D2D bridge, to the substrate to stabilize the known good substrate within the substrate panel similarly as was illustrated in FIG. 1 (step 912). With the method 900 of FIG. 9, the known good substrate may be a PCB. Further, the known good substrate may include embedded capacitors.

The concepts described herein may be extended to apply to more than a two by one substrate panel. Such substrate panels may include an array of substrates organized in a grid pattern with more than two substrates, e.g., M×N array of substrates, wherein each of M and N are non-zero integers exceeding two. The grid pattern may be square, rectangular, substantially circular (to meet a disc shape), or may have another shape. The substrates of the substrate panel may fully populate the grid pattern. Alternately, there may be unpopulated locations within the grid pattern.

The system and methods above has been described in general terms as an aid to understanding details of embodiments of the present invention. Other embodiments of the present include the described application for electric vehicles. In the description herein, numerous specific details are provided, such as examples of components and/or methods, to provide a thorough understanding of embodiments of the present invention. One skilled in the relevant art will recognize, however, that an embodiment of the invention can be practiced without one or more of the specific details, or with other apparatus, systems, assemblies, methods, components, materials, parts, and/or the like. In other instances, well-known structures, materials, or operations are not specifically shown or described in detail to avoid obscuring aspects of embodiments of the present invention.

Reference throughout this specification to "one embodiment", "an embodiment", or "a specific embodiment" means that a particular feature, structure, or characteristic described in connection with the embodiment is included in at least one embodiment of the present invention and not necessarily in all embodiments. Thus, respective appearances of the phrases "in one embodiment", "in an embodiment", or "in a specific embodiment" in various places throughout this specification are not necessarily referring to the same embodiment. Furthermore, the particular features, structures, or characteristics of any specific embodiment of the present invention may be combined in any suitable manner with one or more other embodiments. It is to be understood that other variations and modifications of the embodiments of the present invention described and illustrated herein are possible in light of the teachings herein and are to be considered as part of the spirit and scope of the present invention.

It will also be appreciated that one or more of the elements depicted in the drawings/figures can also be implemented in a more separated or integrated manner, or even removed or rendered as inoperable in certain cases, as is useful in accordance with a particular application.

Additionally, any signal arrows in the drawings/Figures should be considered only as exemplary, and not limiting, unless otherwise specifically noted. Furthermore, the term "or" as used herein is generally intended to mean "and/or" unless otherwise indicated. Combinations of components or steps will also be considered as being noted, where terminology is foreseen as rendering the ability to separate or combine is unclear.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The foregoing description of illustrated embodiments of the present invention, including what is described in the Abstract, is not intended to be exhaustive or to limit the invention to the precise forms disclosed herein. While specific embodiments of, and examples for, the invention are described herein for illustrative purposes only, various equivalent modifications are possible within the spirit and scope of the present invention, as those skilled in the relevant art will recognize and appreciate. As indicated, these modifications may be made to the present invention in light of the foregoing description of illustrated embodiments of the present invention and are to be included within the spirit and scope of the present invention.

Thus, while the present invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the present invention. It is intended that the invention not be limited to the particular terms used in following claims and/or to the particular embodiment disclosed as the best mode contemplated for carrying out this invention, but that the invention will include any and all embodiments and equivalents falling within the scope of the appended claims. Thus, the scope of the invention is to be determined solely by the appended claims.

What is claimed is:

1. A method for constructing an electronic assembly comprising:
    obtaining a group of known good singulated substrates of a plurality of singulated substrates, wherein the substrates are singulated from a constructed panel;
    joining, via a molding compound, the group of known good singulated substrates into a substrate panel,
        wherein each of the known good singulated substrates includes a first plurality of conductors and a second plurality of conductors with a core sandwiched therebetween;
    attaching at least one bridge to the substrate panel that electrically couples at least two of the known good singulated substrates of the group of known good singulated substrates; and
    mounting a plurality of electronic components onto a first side of the substrate panel, each electronic component of the plurality of electronic components corresponding to a respective known good singulated substrate of the group of known good singulated substrates, wherein a fan out package is mounted to a second side of the substrate panel.

2. The method of claim 1, wherein the plurality of singulated substrates comprise Printed Circuit Boards (PCBs).

3. The method of claim 1, wherein at least some of the plurality of singulated substrates are substrates having embedded capacitors.

4. The method of claim 1, further comprising applying solder balls to at least some of the known good singulated substrates of the substrate panel, wherein the plurality of electronic components is mounted to the substrate panel via the solder balls.

5. The method of claim 1, wherein the at least one bridge attaches to the substrate panel via solder balls.

* * * * *